(12) United States Patent
Mori

(10) Patent No.: US 8,171,879 B2
(45) Date of Patent: May 8, 2012

(54) MAINTENANCE SYSTEM, SUBSTRATE PROCESSING APPARATUS, REMOTE OPERATION UNIT AND COMMUNICATION METHOD

(75) Inventor: Takuya Mori, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 497 days.

(21) Appl. No.: 12/372,347

(22) Filed: Feb. 17, 2009

(65) Prior Publication Data
US 2009/0157214 A1 Jun. 18, 2009

Related U.S. Application Data

(62) Division of application No. 10/525,090, filed as application No. PCT/JP03/10156 on Aug. 8, 2003, now Pat. No. 7,524,378.

(30) Foreign Application Priority Data

Aug. 27, 2002 (JP) .................................. 2002-247525

(51) Int. Cl.
*B05C 5/02* (2006.01)
(52) U.S. Cl. .......... 118/696; 118/708; 118/712; 700/15; 700/121; 700/123
(58) Field of Classification Search .................. 118/696, 118/708, 712; 700/121, 123, 15; 340/3.1, 340/3.71
See application file for complete search history.

(56) References Cited

U.S. PATENT DOCUMENTS

| | | | |
|---|---|---|---|
| 4,390,953 A * | 6/1983 | Johnstone | 700/177 |
| 5,396,443 A | 3/1995 | Mese et al. | |
| 6,379,465 B1 | 4/2002 | Perkins et al. | |
| 6,725,181 B2 * | 4/2004 | Hu et al. | 702/188 |
| 2002/0064138 A1 | 5/2002 | Saito et al. | |

FOREIGN PATENT DOCUMENTS

| | | | |
|---|---|---|---|
| EP | 1160839 | | 12/2001 |
| EP | 1164437 | | 12/2001 |
| JP | 2000155613 | * | 6/2000 |
| JP | 2002027567 A | | 1/2002 |
| JP | 2002-196815 | | 7/2002 |
| JP | 2002-231595 | | 8/2002 |

* cited by examiner

*Primary Examiner* — Laura Edwards
(74) *Attorney, Agent, or Firm* — Oblon, Spivak, McClelland, Maier & Neustadt, L.L.P.

(57) ABSTRACT

A substrate processing apparatus having various types of elements including a substrate carrier member for performing a substrate processing; and a control section in which a remote operation information transmitted from a remote control unit in a remote place through a communication network is provided only when there is an allow setting of a remote operation by a worker of the substrate processing apparatus with the safety of the remote operation work being confirmed, and the various types of elements are controlled based on the provided remote operation information.

7 Claims, 13 Drawing Sheets

FIG. 14

EXPLANATION OF CODES

1    MAINTENANCE SYSTEM

2    FACTORY

3    COMMUNICATION CONTROL UNIT

4    VENDOR

5    COMPUTER

6    INTERNET

7    LAN

M1~Mn    COATING AND DEVELOPING SYSTEM

W    WAFER

MAINTENANCE SYSTEM, SUBSTRATE PROCESSING APPARATUS, REMOTE OPERATION UNIT AND COMMUNICATION METHOD

CROSS-REFERENCE TO RELATED APPLICATIONS

This application is a divisional of U.S. application Ser. No. 10/525,090 filed Feb. 23, 2005, now U.S. Pat. No. 7,524,378, the entire contents of which is incorporated herein by reference. U.S. Ser. No. 10/525,090, is the National Stage of International Application No. PCT/JP03/10156 filed Aug. 8, 2003, which claims the benefit of priority under 35 U.S.C. §119 from Japanese Patent Application No. 2002-247525 filed Aug. 27, 2002.

TECHNICAL FIELD

This invention relates to a maintenance system of a substrate processing apparatus, a substrate processing apparatus, a remote operation unit and a communication method.

BACKGROUND ART

The fabrication of a semiconductor device is performed in the coating and developing system, an aligner, an etching device and so on installed in a factory. For example, in the coating and developing system, a plurality of processing units such as a resist coating unit, a developing unit, a heating processing unit and the like, and a substrate carrier unit and the like are mounted. A photolithography process in the fabrication of the semiconductor device is performed by sequentially carrying a substrate to respective processing units by the substrate carrier unit and giving predetermined processing to the substrate in respective processing units.

When some trouble including the failure occurs in the above-described coating and developing system, a worker of a factory where the coating and developing system is installed needs to cope with the trouble. The worker also needs to perform a periodical maintenance for the coating and developing system.

However, since the factory worker is not an engineer who fabricates the coating and developing system itself, he/she usually is not knowledgeable about the coating and developing system. Thus, when the trouble occurs in the coating and developing system, the worker in the side of the factory cannot make an appropriate response in many cases. In such case, the factory worker conventionally entrusts the treatment of the trouble to a manufacturer of the coating and developing system. A person in charge working at the entrusted manufacturer gives an instruction by means of the telephone or the facsimile, or visits the factory where the coating and developing system is installed and copes with the trouble by himself/herself.

However, when the person of the manufacturer gives the instruction by the telephone or the facsimile, the detailed information cannot be given or received between each other so that the trouble cannot be dealt with appropriately and immediately. When the person of the manufacturer visits the factory, it takes time to arrive there so that the immediate response cannot be made in many cases. And further, when some troubles occur in plural places at the same time, plural persons in charge have to be sent. In this case, since there definitely exists the difference between the coping abilities of respective persons in charge, the quality of the response of trouble sometimes varies. In order to solve the problems, a remote maintenance system for operating the coating and developing system from a remote place and solving the trouble of the coating and developing system using a communication network such as an Internet, and a LAN (local area network) can be proposed. According to the remote maintenance system, a skilled person in charge at the manufacturer can cope with the trouble or the periodical maintenance immediately and appropriately.

The operation from the remote place is the operation from the place not seen. If the person in charge at the manufacturer who is in the remote place drives the coating and developing system without knowing that the worker approaches the coating and developing system in the factory, the worker is involved in a risk of being injured by a touch of worker with a moved member by the driving. In addition, when a third person approaches the substrate processing apparatus without knowing that the remote operation is performed during the absence of the worker of the substrate processing apparatus from the field, the third person has the risk to be injured by a sudden driving. To secure the safety of the remote operation, some kind of measures need to be taken.

DISCLOSURE OF THE INVENTION

The present invention is made in view of the aforementioned point, and its object is to provide a maintenance system, a substrate processing apparatus, a remote operation unit and a communication method capable of sufficiently securing the safety for a remote maintenance work of the substrate processing apparatus including a coating and developing system.

The present invention is a maintenance system of a substrate processing apparatus including a remote operation unit for operating the substrate processing apparatus from a remote place by transmitting a remote operation information to a side of the substrate processing apparatus via a communication network, and by providing the remote operation information to the substrate processing apparatus, a communication control unit for receiving the remote operation information transmitted to the side of the substrate processing apparatus and providing the remote operation information to the substrate processing apparatus. The communication control unit provides the remote operation information to the substrate processing apparatus only when there exists an allow setting for the remote operation by a worker in the side of the substrate processing apparatus. The remote place is not limited to the outside of the factory but can be a place inside the same factory.

According to the present invention, since the remote operation information is provided to the substrate processing apparatus by the communication control unit only when there exists the allow setting by the worker, the substrate processing apparatus is not operated when the worker is not aware of the operation. In addition, when the worker leaves the field during the maintenance work by some reason, the remote operation is made to be disabled by changing the setting to a deny setting so that a third person cannot approach the substrate processing apparatus during the remote operation. Therefore, the worker or the third person will not be injured by touching the substrate processing apparatus during the remote operation, as a result, the safety of the remote maintenance work is improved.

The communication control unit includes an allow-setting section performing the allow setting of the remote operation, and the allow-setting section can be provided only in the side of the substrate processing apparatus of the communication network. In this case, the allow setting of the remote operation cannot be performed from the side of the remote operation unit. Thus, the side of performing the remote operation cannot arbitrarily change the setting to the allow setting and cannot perform the remote operation so that the substrate processing apparatus is not driven against the will of the worker of the substrate processing apparatus.

The allow setting of the remote operation can be divided into plural stages. In this case, the riskless remote operation alone can be selectively allowed according to the condition. For example, an allow setting of the remote operation accompanying a driving of the substrate processing apparatus and an allow setting not accompanying the driving of the substrate processing apparatus can be respectively included in separate stages. In such case, only the remote operation not accompanying the driving of the substrate processing apparatus such as a changing operation of a setting value can be allowed, and the remote operation accompanying the driving of the substrate processing apparatus can be denied. Accordingly, when, for example, the worker temporarily leaves the field, a part of the remote operation can be continued so that the maintenance work can be effectively performed.

The remote operation accompanying the driving of the substrate processing apparatus can be a remote operation accompanying a physical movement for various types of elements including a substrate carrier member in the substrate processing apparatus, and the remote operation not accompanying the driving of the substrate processing apparatus can be a remote operation not accompanying the physical movement for various types of elements. Additionally, the remote operation accompanying the driving of the substrate processing apparatus can include a position adjustment for a substrate carrier arm, a resist solution discharge nozzle in a resist coating unit and a developing solution discharge nozzle in a developing unit in the substrate processing apparatus, and a movement confirmation for the substrate carrier arm, the resist solution discharge nozzle and the developing solution discharge nozzle. Whereas the remote operation not accompanying the driving of the substrate processing apparatus can include a setting change for a discharge amount of the resist solution, a discharge pressure of the resist solution, a turning speed of the substrate, an atmospheric temperature and an atmospheric humidity in the resist coating unit, and a setting change for a discharge amount of the developing solution, a discharge pressure of the developing solution, an atmospheric temperature and an atmospheric humidity in the developing unit, and a setting change for a heating temperature and a heating time of the substrate in a heating unit.

In the side of the substrate processing apparatus, a sensor for detecting an approach of a person to the substrate processing apparatus. In this case, for example, since the approach from the place not seen from the worker can be detected, it is possible to give a warning to the person or to stop the remote operation. Therefore, the safety of the remote operation is secured.

An operation for starting the detection by the sensor can be performed in the side of the substrate processing apparatus or in the side of the remote operation unit with a communication network put therebetween, and an operation for stopping the detection by the sensor can be performed only in the side of the substrate processing apparatus. In such case, for example, when the remote operation is started, the sensor can be activated both from the side of the substrate processing apparatus and from the side of the remote operation unit. In addition, the operation for stopping the detection by the sensor can be performed only from the side of the substrate processing apparatus so that the failure of detection of the approach by a person to the substrate processing apparatus, which is caused by a person in the side of the remote operation unit accidentally stopping the detection of the sensor, can be prevented.

The aforementioned sensor can selectively detect a person other than the worker identified in advance. In this case, the approach of a person other than the worker taking charge of the remote operation is allowed to be detected to secure the safety of the person other than the worker in charge. The worker in charge can approach the substrate processing apparatus and continue the maintenance work even in the middle of the remote operation so that the maintenance work can be finished much sooner. The information communication performed through the communication network in the above maintenance system can be enabled only when there exists an allow setting for the communication. In this case, a classified information in the side of the substrate processing apparatus or the side of the remote operation unit is prevented from leaking out.

The substrate processing apparatus of the present invention has various types of elements including a substrate carrier member for performing the substrate processing, and a control section in which a remote operation information transmitted from the remote operation unit in the remote place through the communication network is provided only when there is the allow setting by the worker of the substrate processing apparatus who confirms the safety of the remote operation work, and the various types of elements are controlled based on the provided remote operation information. According to the present invention, the substrate processing apparatus does not suddenly begin to operate, and the safety of the worker is secured.

An allow-setting section performing the allow setting of the remote operation can be provided only in the side of the substrate processing apparatus of the communication network, and the allow setting of the remote operation can be divided in plural stages, and allow setting of the remote operation accompanying the driving of the substrate processing apparatus and the allow setting of the remote operation not accompanying the driving of the substrate processing apparatus are respectively included in separate stages. The remote operation accompanying the driving of the substrate processing apparatus can be a remote operation accompanying a physical movement with respect to the various types of elements, and the remote operation not accompanying the driving of the substrate processing apparatus can be a remote operation not accompanying the physical movement of the various types of elements. Additionally, the remote operation accompanying the driving of the substrate processing apparatus can include a position adjustment for a substrate carrier arm, a resist solution discharge nozzle in a resist coating unit and a developing solution discharge nozzle in a developing unit, and a movement confirmation for the substrate carrier arm, the resist solution discharge nozzle and the developing solution discharge nozzle. Whereas the remote operation not accompanying the driving of the substrate processing apparatus can include a setting change for a discharge amount of the resist solution, a discharge pressure of the resist solution, a turning speed of the substrate, an atmospheric temperature and an atmospheric humidity in the resist coating unit, and a setting change for the discharge amount of the developing solution, the discharge pressure of the developing solution, the atmospheric temperature and the atmospheric humidity in the developing unit, and the setting change for a heating temperature and a heating time of the substrate in a heating unit.

The substrate processing apparatus can include a sensor for detecting an approach of a person, and an operation for starting the detection by the sensor can be performed in the side of the substrate processing apparatus or the side of the remote operation unit with a communication network put therebetween, and an operation for stopping the detection by the sensor can be performed only in the side of the substrate processing apparatus. The sensor can selectively detect the approach of a person other than workers identified in advance. The above-described information communication performed through the communication network in the substrate processing apparatus can be possible only when there exists the allow setting for the communication.

The remote operation unit of the present invention can remotely operate the substrate processing apparatus by transmitting the remote operation information to the side of the substrate processing apparatus through the communication network and by providing the remote operation information to the substrate processing apparatus, and the remote operation information transmitted to the side of the substrate processing apparatus is provided to the substrate processing apparatus only when there exists the allow setting for the remote operation by the worker in the side of the substrate processing apparatus. According to the present invention, the remote operation is performed only when there is the permission by the worker so that the safety of the worker and those around the worker can be secured.

An allow-setting section performing the allow setting of the remote operation can be provided only in the side of the substrate processing apparatus of the communication network, and the allow setting of the remote operation can be divided into plural stages. The allow setting of the remote operation accompanying a driving for the substrate processing apparatus and the allow setting not accompanying the driving for the substrate processing apparatus can be included in separate stages. The remote operation accompanying the driving of the substrate processing apparatus can be a remote operation accompanying a physical movement for various types of elements including a substrate carrier member in the substrate processing apparatus, and the remote operation not accompanying the driving of the substrate processing apparatus can be a remote operation not accompanying the physical movement of the various types of element. Additionally, the remote operation accompanying the driving of the substrate processing apparatus can include a position adjustment for a substrate carrier arm, a resist solution discharge nozzle in a resist coating unit and a developing solution discharge nozzle in a developing unit in the substrate processing apparatus, and a movement confirmation for the substrate carrier arm, the resist solution discharge nozzle and the developing solution discharge nozzle. Whereas the remote operation not accompanying the driving of the substrate processing apparatus can include a setting change for a discharge amount of the resist solution, a discharge pressure of the resist solution, a turning speed of a substrate, an atmospheric temperature and an atmospheric humidity in the resist coating unit, and a setting change for the discharge amount of the developing solution, the discharge pressure of the developing solution, the atmospheric temperature and the atmospheric humidity in the developing unit, and a setting change for a heating temperature and a heating time of the substrate in a heating unit.

In the side of the substrate processing apparatus, a sensor for detecting an approach by a person to the substrate processing apparatus can be provided, an operation for starting the detection by the sensor can be performed in the side of the substrate processing apparatus or in the side of the remote operation unit with a communication network put therebetween, and an operation for stopping the detection by the sensor can be performed only in the side of the substrate processing apparatus. The sensor can selectively detect the approach of a person other than workers identified in advance. The information communication in the above remote operation unit through the communication network can be possible only when there is an allow setting for the communication.

A communication method of the present invention is a communication method performed between a remote operation unit for operating a substrate processing apparatus from a remote place and the substrate processing apparatus through a communication network, allow/deny settings of the communication with respect to various kinds of information communicated between the remote operation unit and the substrate processing apparatus can be set in the side of the substrate processing apparatus. When the substrate processing apparatus is normally running, the communication of the various kinds of information is set to a deny setting, whereas when the trouble occurs in the substrate processing apparatus, the communication of the various kinds of information is selectively set to an allow setting. According to the invention, a person in charge in the side of the remote operation unit cannot unilaterally communicate with the substrate processing apparatus and cannot remotely operating the substrate processing apparatus without receiving the permission by the worker in the side of the substrate processing apparatus, so that the safety of the remote operation can be secured. In addition, since the side of the substrate processing apparatus can select the information which can be communicated, for example, a classified information possessed by the side of the substrate processing apparatus can be prevented from being known by the side of the remote operation unit.

BRIEF DESCRIPTION OF THE DRAWINGS

FIG. 14 is a depiction of the codes for the elements shown in the specification.

BEST MODE FOR CARRYING OUT THE INVENTION

Figure 1:
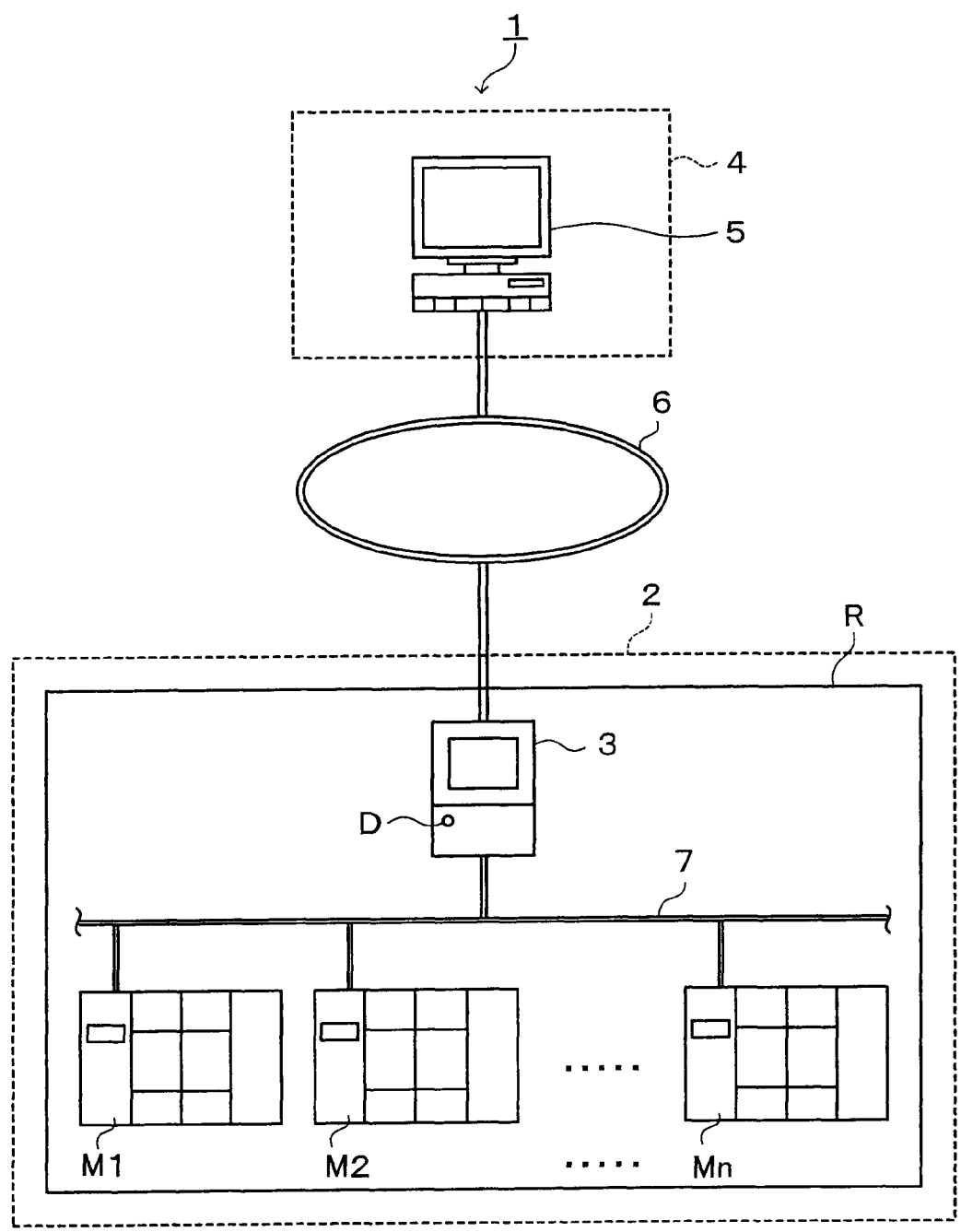
FIG. 1 is a schematic configuration diagram of a maintenance system according to the present invention.

Hereinafter, a preferred embodiment of the present invention will be described. FIG. 1 is a schematic configuration diagram of a maintenance system 1 according to the present embodiment.

The maintenance system 1 is a system for maintaining a coating and developing system as a substrate processing apparatus from a remote place. The maintenance system 1 includes a plurality of coating and developing systems M1~Mn and a communication control unit 3 in a side of a factory 2 in which wafers are manufactured, and includes a computer 5 as a remote operation unit in a side of a vendor as a manufacturer of the coating and developing systems M1~Mn. The coating and developing systems M1~Mn are installed in a clean room in the factory 2.

The computer 5 in the side of the vendor 4 is connected to the communication control unit 3 in the side of the factory 2 through an Internet 6, and the computer 5 and the communication control unit 3 can communicate each other. Between the Internet 6 and the computer 5, and between the Internet 6 and the communication control unit 3, firewalls not shown are respectively installed to prevent an access of a third person to each terminal. The communication control unit 3 is connected to the respective coating and developing systems M1~Mn by a LAN 7 constructed in, for example, the factory 2. According to such configuration, the computer 5 can communicate with the coating and developing systems M1~Mn via the Internet 6 and the communication control unit 3.

Figure 2:
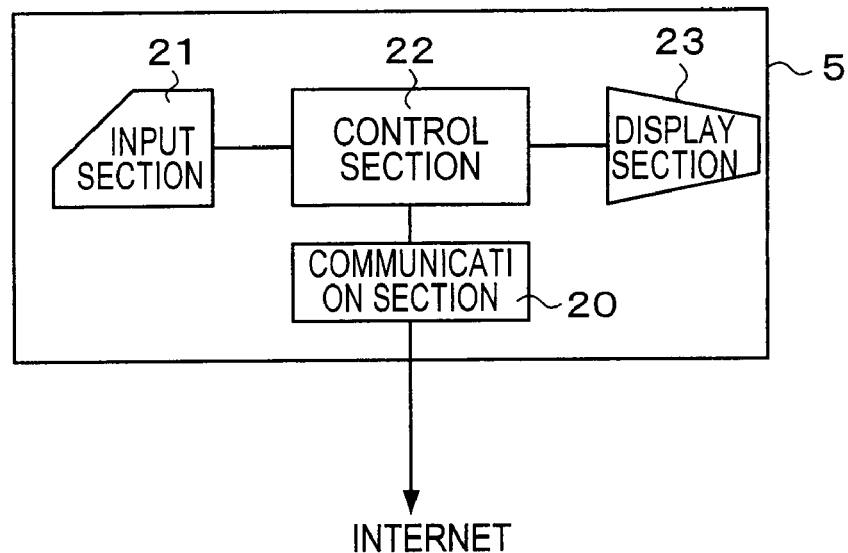
FIG. 2 is a block diagram showing a configuration of a computer.
Figure 3:
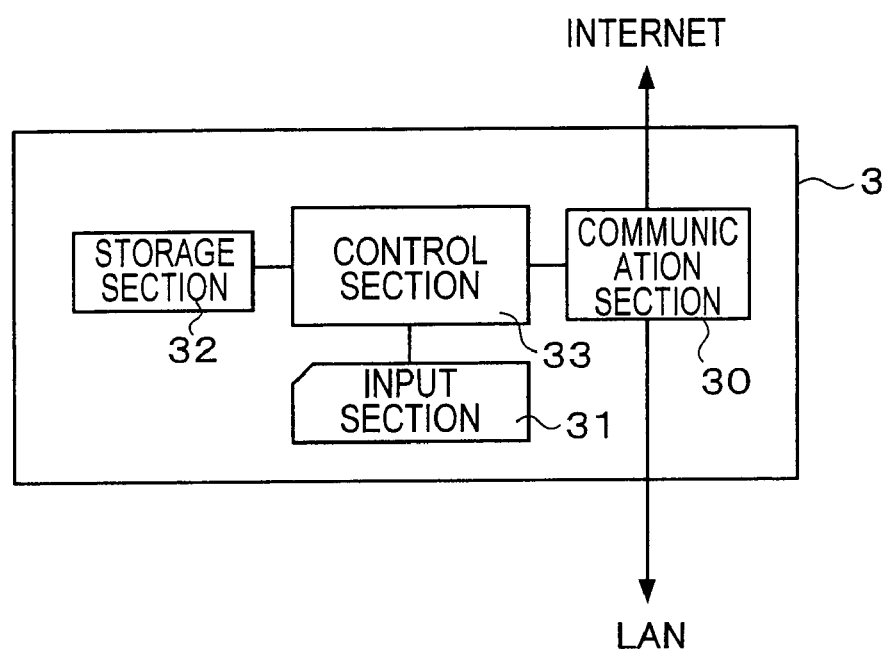
FIG. 3 is a block diagram showing a configuration of communication control unit.

The computer 5 in the side of the vendor 4 will be explained. The computer 5 is an apparatus for remotely operating the coating and developing systems M1~Mn. The computer 5, for example, includes a communication section 20, an input section 21, a control section 22, and a display section 23 as shown in FIG. 2.

The communication section 20 is directly connected to the Internet 6, and various kinds of information or signals can be given and received between the computer 5 and the communication control unit 3 by the communication section 20. Therefore, the computer 5 can receive a trouble information concerning the coating and developing systems M1~Mn transmitted from the side of communication control unit 3 and can transmit a remote operation information for remotely operating the coating and developing systems M1~Mn to the side of the communication control unit 3. Note that the above described trouble information includes various types of setting information and image information at the time of occurrence of the trouble, and various types of log information until the trouble occurs. The remote operation information includes a static remote operation information for performing a remote operation not accompanying a driving of various types of elements, for example, in the coating and developing system M1~Mn and a dynamic remote operation information for performing the remote operation accompanying a driving of the various types of elements in the coating and developing systems M1~Mn. The static remote operation information has, for example, a setting-change information for changing the various types of elements in the coating and developing systems M1~Mn. The dynamic remote operation information has, for example, a driving-adjustment information for adjusting the various types of elements (driving elements) in the coating and developing systems M1~Mn to be driven when processing wafers by physically moving the elements in effect, or a movement-confirmation information for confirming the movement after a maintenance work.

An information requirement signal can be inputted to the input section 21, which requires a transmission of the trouble information from the communication control unit 3 in the case of the occurrence of trouble, for example, in the coating and developing systems M1~Mn. In addition, the remote control information can be inputted to the input section 21. Namely, a person in charge in the side of the vendor 4 can change the setting of the various types of elements in the coating and developing systems M1~Mn which is in a remote place or can adjust the driving elements by moving them. In the input section 21, for example, a pointing device such as a key board having a cursor key or a numeric input, and a mouse are used, and the remote operation information and the like can be inputted to the computer 5 by a pressing signal of a key pressed on the keyboard or a position signal of the mouse.

The control section 22 controls the entire computer 5, where various kinds of programs are performed, for example, based on various types of information or signals from the communication control unit 3 or the input section 21. Note that a CPU (Central Processing Unit), for example, is used in the control section 22.

On the display section 23, for example, the received trouble information can be displayed. In the display section 23, for example, a dot matrix type color liquid crystal display cell or a CRT (Cathode Ray Tube) is used. Besides, the display section 23 may be a touch screen, in which case the remote operation information and the like can be directly inputted as the input section. And further, an operation screen of the input/display device 93 of each of the coating and developing systems M1~Mn which will be described later can be displayed on the display section 23, and the above-described trouble information may be displayed or the remote operation information may be inputted, using the operation screen.

Next, the communication control unit 3 will be explained. The communication control unit 3 is installed in the clean room R in the factory 2 with the coating and developing systems M1~Mn as shown in FIG. 1. The communication control unit 3 includes a communication section 30, an input section 31 as an allow-setting section, a storage section 32 and a control section 33. For example, a modem is used for the communication section 30, a touch screen is used for a input section 31, a RAM (Random Access Memory) is used for the storage section 32, and a CPU is used for a control section 33.

The communication section 30 is connected to the LAN 7 and the Internet 6 in the factory 2, and the communication control unit 3 can communicate various kinds of information and signals between the coating and developing systems M1~Mn and the computer 5. Namely, the communication section 30 can transmit the information received from the computer 5 to the coating and developing systems M1~Mn or can transmit the information received from the coating and developing systems M1~Mn to the side of the computer 5.

Figure 4:
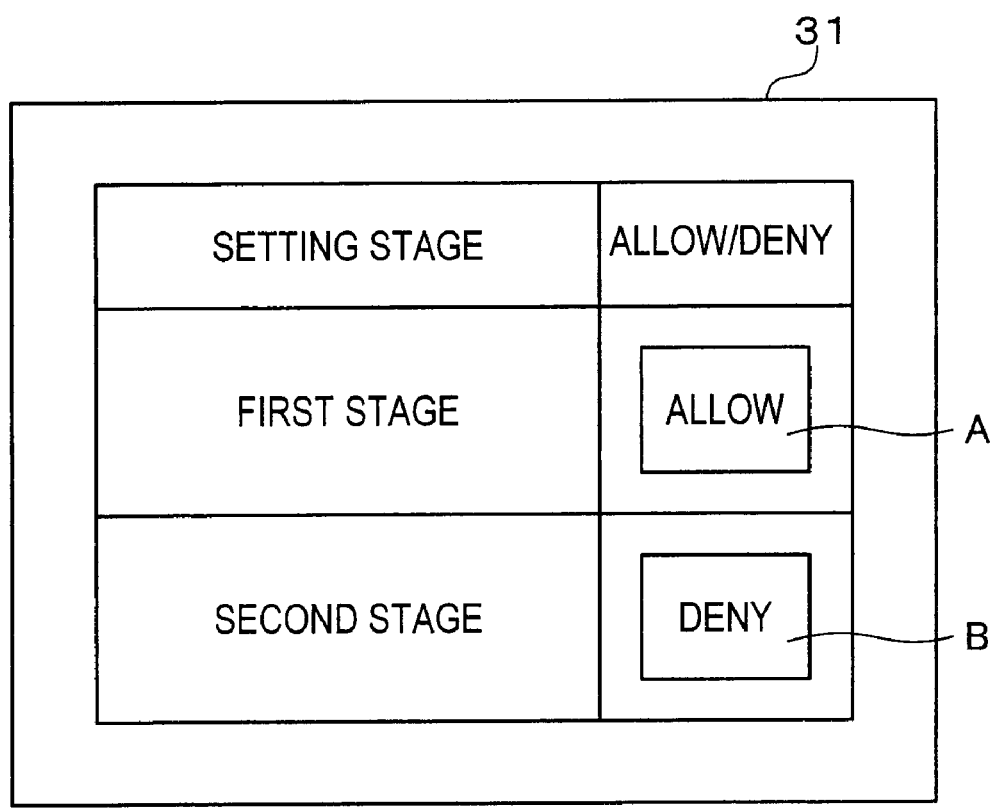
FIG. 4 is an explanatory diagram showing an example of a setting screen of the communication control unit.

The input section 31 can transmit the remote operation information received from the computer 5 to the coating and developing systems M1~Mn and can perform an allow/deny setting whether the remote operation based on the remote operation information is allowed or not. The allow/deny setting is divided into plural stages, for example, two stages. The allow/deny setting of the first stage includes the remote operation information not accompanying a physical movement with respect to various types of elements in the coating and developing systems M1~Mn, that is, a static remote operation information. Specifically, the allow/deny setting of a first stage includes the setting-change information for changing various types of settings such as, a discharge amount and a discharge pressure of a resist solution, the turning speed of a wafer W, atmospheric temperature and humidity at a resist coating unit, the discharge amount and the discharge pressure of a developing solution, the atmospheric temperature and humidity in a developing unit, and a heating temperature and a heating time in a baking unit in the coating and developing system M1. The allow/deny setting of a second stage includes the remote operation information accompanying the physical movement with respect to the various types of elements in the coating and developing systems M1~Mn, that is, a dynamic remote operation information. To be more specific, the allow/deny setting of the second stage includes a position adjustment information for adjusting the positions of a wafer carrier arm in a carrier unit, a resist solution discharge nozzle in the resist coating unit and a developing solution discharge nozzle in the developing unit in the coating and developing systems M1~Mn by actually moving them, and a movement-confirmation information for confirming movements of the adjusted or setting-changed wafer carrier arm, the resist solution discharge nozzle, the developing solution discharge nozzle and the like. The allow/deny settings can be performed by a worker pressing setting buttons in respective stages A, B in the touch screen of the input section 31, for example, as shown in FIG. 4. In addition, in the static remote operation information including above-described plural contents, the allow/deny settings with respect to these contents can be set by a batch setting, whereas the allow/deny settings can be set depending on respective contents such that the discharge amount of resist solution is "allow" and the discharge pressure is "deny". In the case that the allow/deny settings are set depending on the respective contents, the setting buttons are provided depending on the respective contents. Also in the dynamic remote operation information, the allow/deny settings with respect to the contents can be set by the batch setting in the same way as the static remote operation information, whereas the allow/deny settings can be set depending on respective contents.

In the storage section 32, various kinds of programs including a program for performing the above-described allow/deny settings are stored. The control section 33 can read and execute the program stored in the storage section 32.

In the communication control unit 3, as shown in FIG. 1, a communication allow/deny setting button D as an allow-setting section for a communication is provided, which sets the information communication with the side of the vendor 4 performed through the Internet 6 to the allow setting or the deny setting depending on various kinds of information. Thus, only the information of which setting for allowing the communication is the allow setting can be bi-directionally communicated between the communication control unit 3 and the computer 5.

Figure 5:
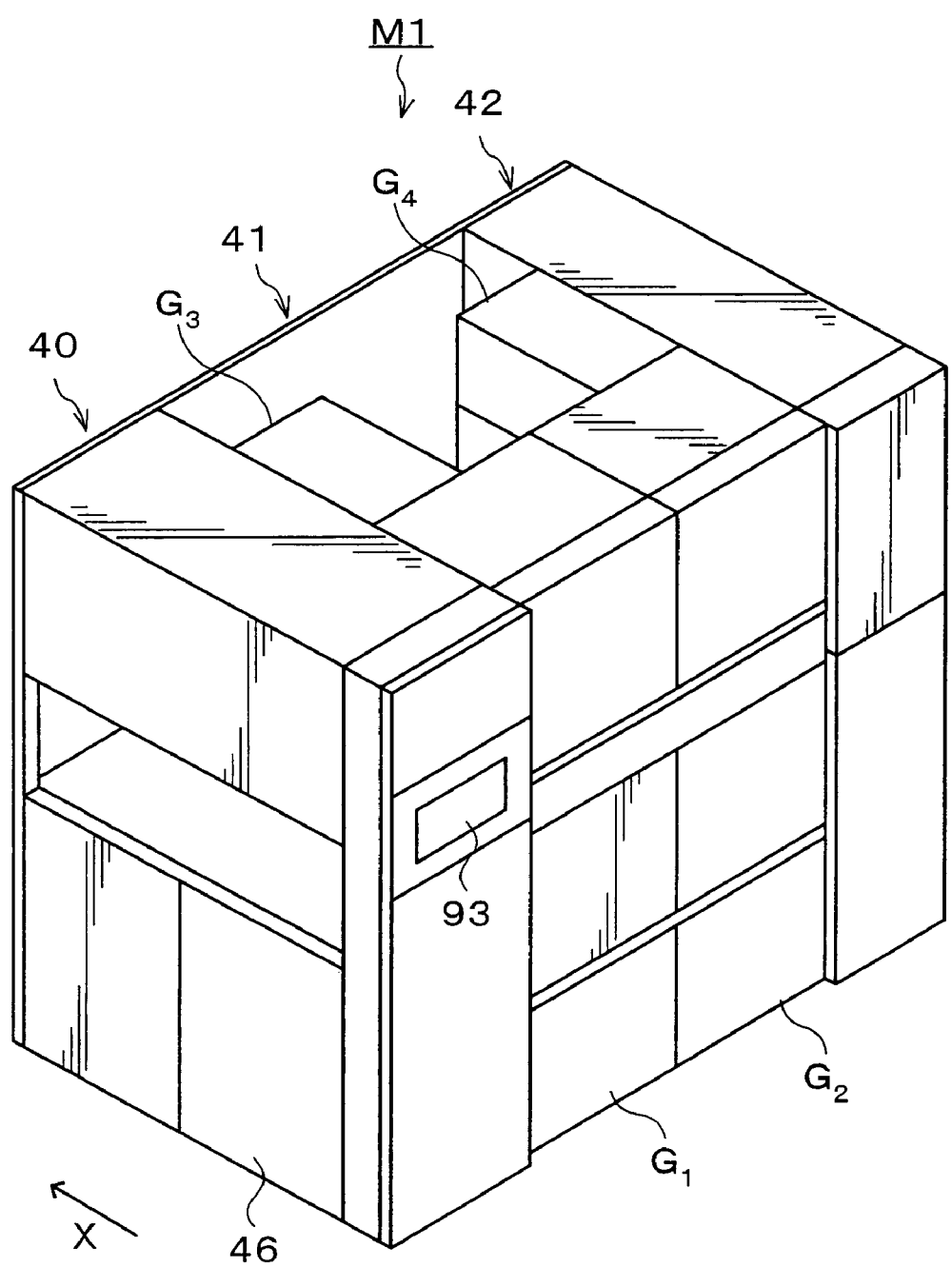
FIG. 5 is a perspective view showing an outline of a coating and developing system constituting the maintenance system.

Subsequently, the configuration of the coating and developing systems M1~Mn will be explained with a coating and developing system M1 using as an example. The coating and developing system M1 is a treatment apparatus which can execute a photolithography process in manufacturing processes of a semiconductor device by sequentially performing a single wafer processing for the wafer W. FIG. 5 is a perspective view showing a schematic configuration of the coating and developing system M1, and FIG. 6 is a plan view showing the schematic configuration of the coating and developing system M1.

For example, the coating and developing system M1 has a structure with a cassette station 40 carrying, for example, the twenty-five wafers W in the coating and developing system M1 from outside or carrying them out of the coating and developing system M1 in the unit of cassette, or carrying the wafers W in or out of the cassette C, a processing station 41 having various types of processing units in which the single wafer processing of wafers W are performed, and an interface section 42 transfers the wafer W to and from an aligner not shown provided adjacently to the processing station 41 integrally connected.

Figure 6:
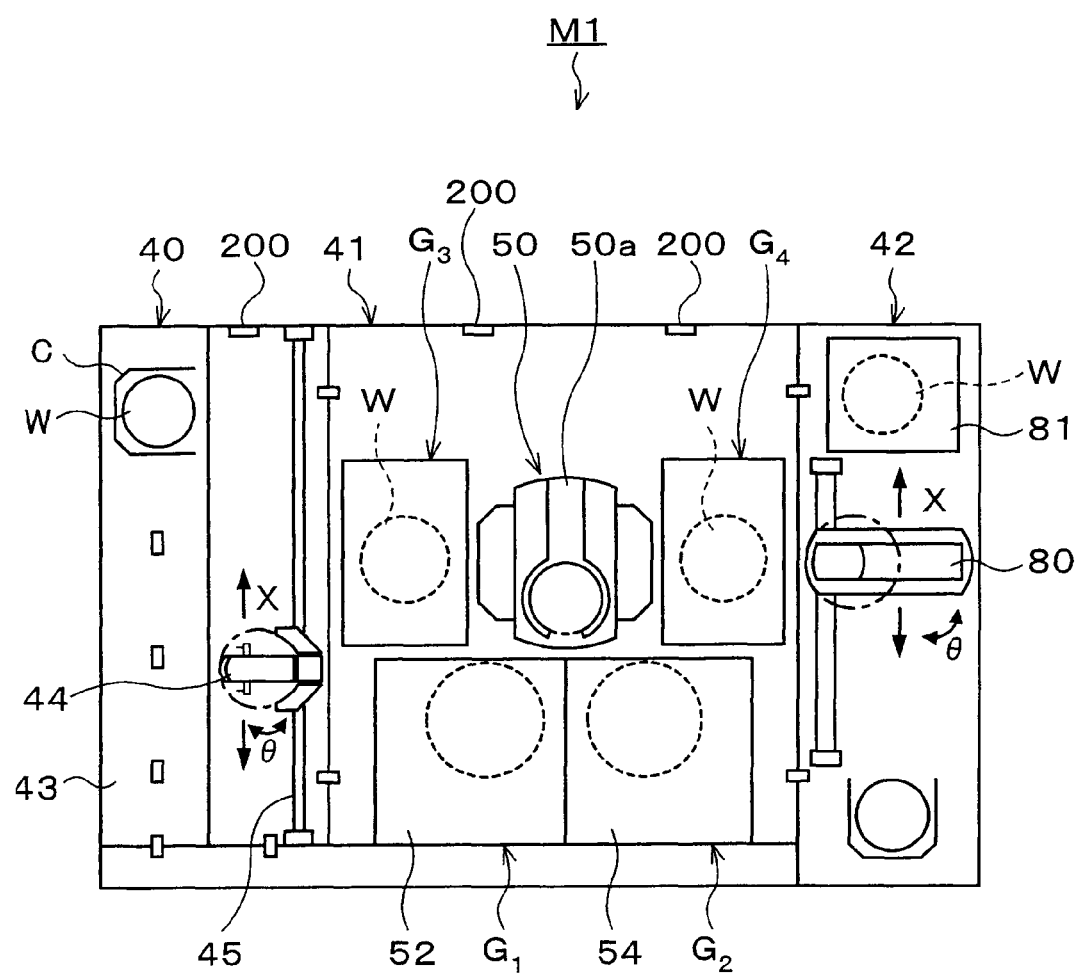
FIG. 6 is a plan view showing an outline of a structure of the coating and developing system of FIG. 5.
Figure 7:
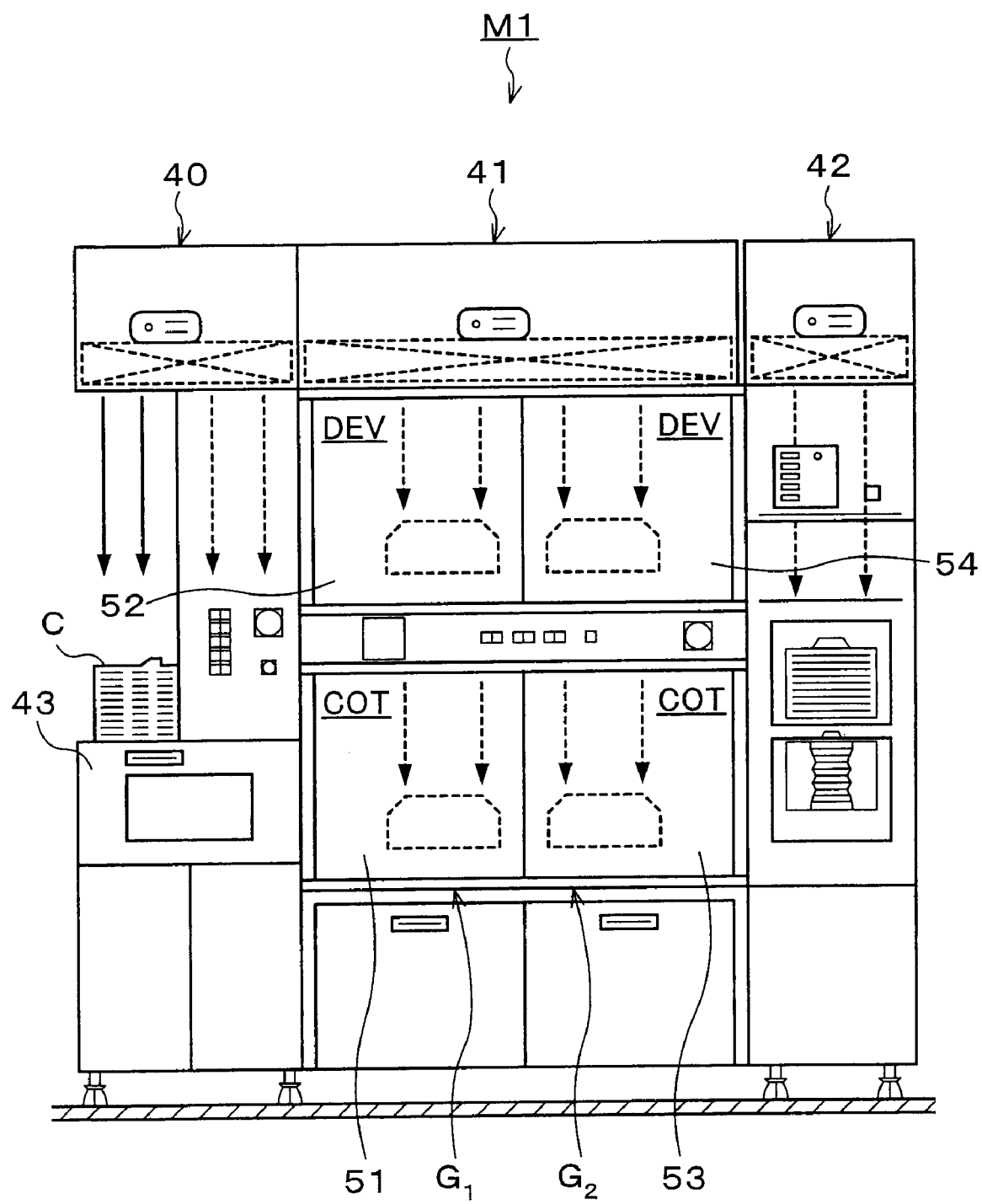
FIG. 7 is a front view of the coating and developing system of FIG. 5.

In the cassette station 40, a plurality of cassettes C can be mounted in a line in the predetermined position on a cassette mounting table 43 in the X direction (vertical direction in FIG. 6), as shown in FIG. 6. A wafer carrier unit 44 is provided along a carrier guide 45 movable in the X direction in the cassette station 40. The wafer carrier unit 44 can carry the wafer W in and out of the cassette C. The wafer carrier unit 44 is also accessible to an extension unit 63 belonging to a third processing unit group G3 in the side of the processing station 41 as described later. In the cassette station 40, a later-described control section 46 of the coating and developing system M1 is provided as shown in FIG. 5. Note that CCD cameras as being image pickup members are attached to plural positions in the coating and developing system M1 as shown in FIG. 6, the condition in the coating and developing system M1 can be captured in image by means of the CCD camera.

In the processing station 41, a main carrier unit 50 is provided in the center thereof as shown in FIG. 5. The main carrier unit 50 including a wafer carrier arm 50a as being a substrate carrier member whereby the wafer W can be held and moved, and can carry the wafer W to the predetermined carrier position by moving the wafer carrier arm 50a. A plurality of processing unit groups G1, G2, G3 and G4 in which various types of processing units are arranged in multistage are provided in the peripheral of the main carrier unit 50. For example, a first and a second processing unit groups G1 and G2 are arranged in the front side of the coating and developing system M1. In the first processing unit group G1, a resist coating unit 51 for coating the resist solution to the wafer W and a developing unit 52 for developing the wafer W are provided in two-tiers in the order from below.

Figure 8:
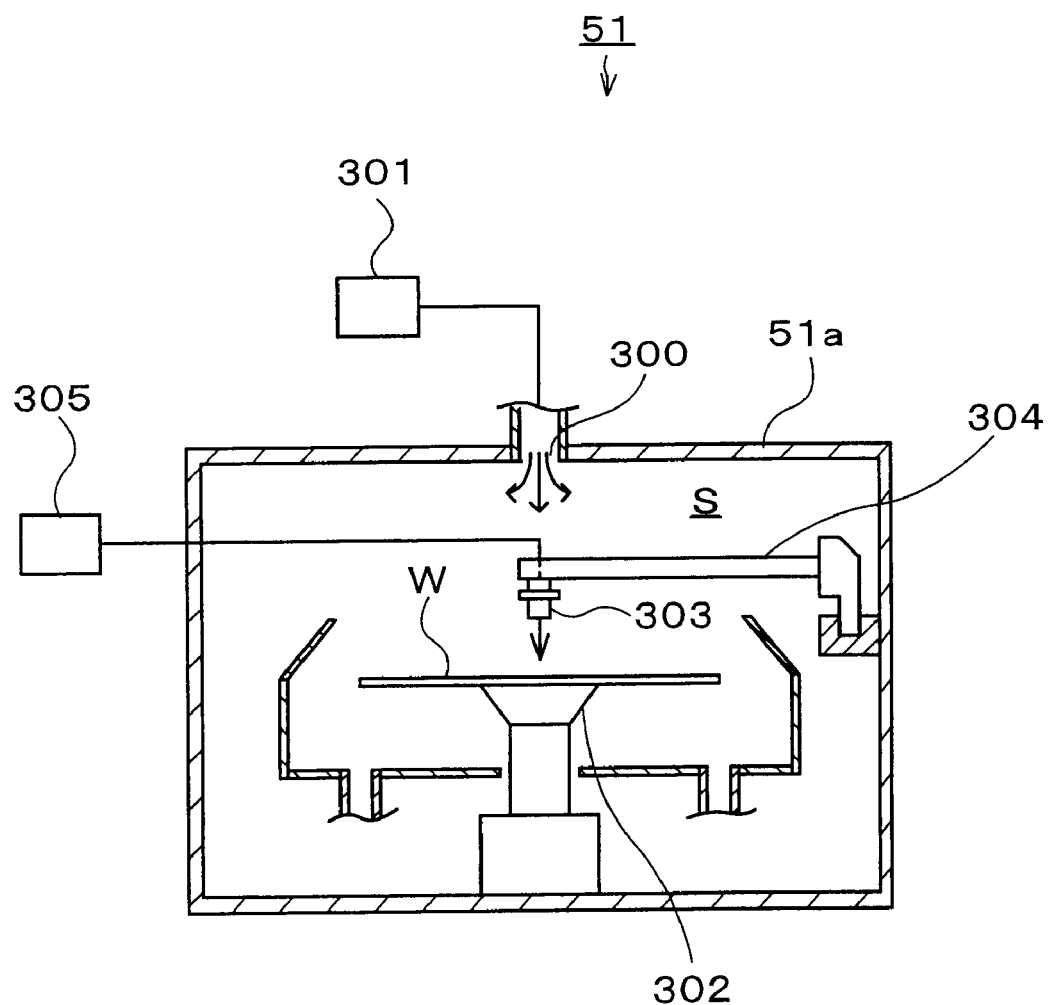
FIG. 8 is an explanatory view showing an outline of a structure of a resist coating unit.

The resist coating unit 51, as shown in FIG. 8, is composed of various types of elements such as a temperature and humidity regulator 301 for maintaining a process chamber S to be a predetermined atmosphere, which supplies the gas having predetermined temperature and humidity in the process chamber S from a gas supply port 300 formed, for example, at a casing 51a, a spin chuck 302 holding and turning the wafer W in the process chamber S, a resist solution discharge nozzle 303 supplying the resist solution to the wafer W held by the spin chuck 302, a nozzle arm 304 moving the resist solution discharge nozzle 303 to the predetermined discharge position, and a resist solution supply device 305 for discharging the resist solution in the predetermined flow rate and pressure from the resist solution discharge nozzle 303 and so on. The resist coating treatment is performed by discharging the predetermined rate of resist solution from the resist solution discharge nozzle 303 to the wafer W turned by the spin chuck 302 and by diffusing the resist solution on the surface of the wafer W.

Figure 9:
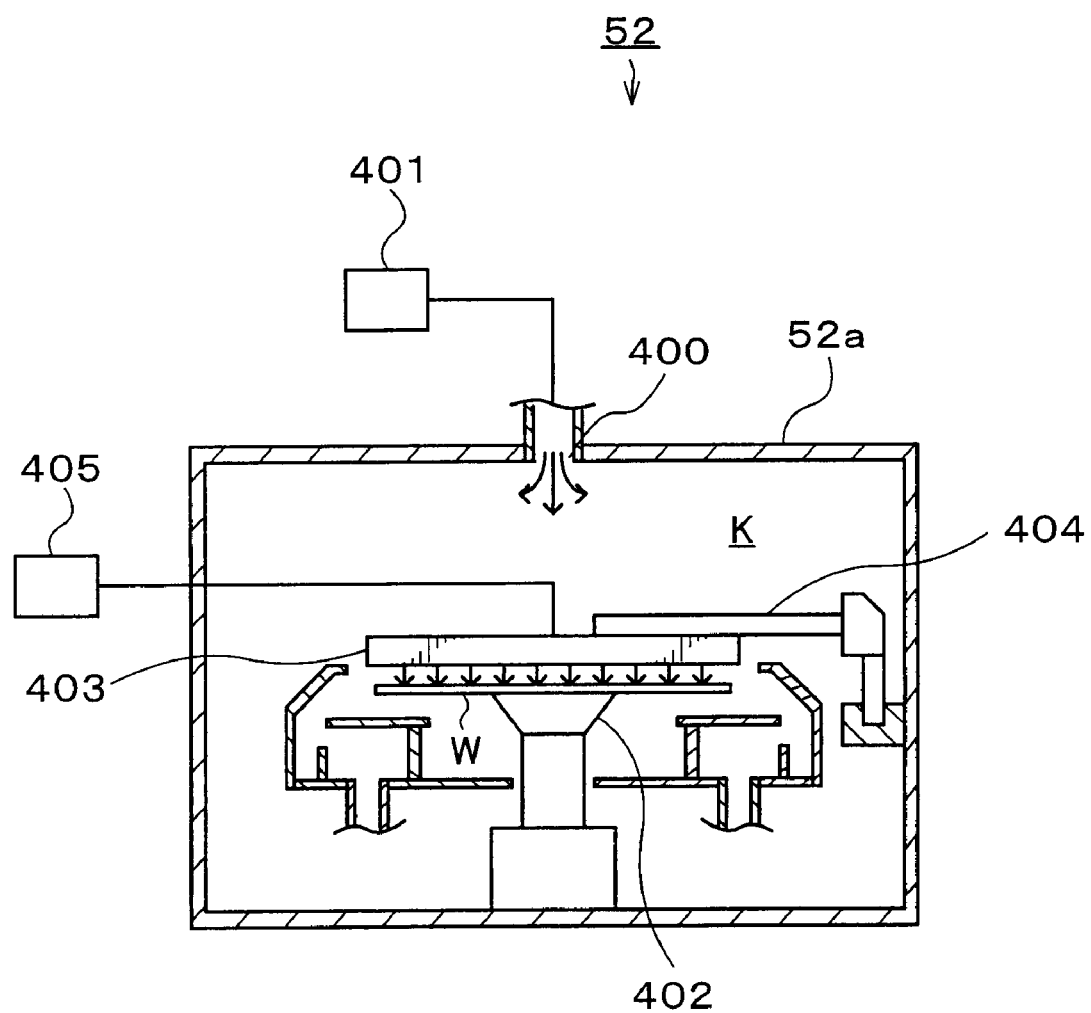
FIG. 9 is an explanatory view showing an outline of structure of a developing unit.

The developing unit 52, as shown in FIG. 9 is composed of various types of elements such as a temperature and humidity regulator 401 for maintaining a process chamber K to be a predetermined atmosphere, which supplies the gas having predetermined temperature and humidity in the process chamber K from a gas supply port 400 formed, for example, at a casing 52a, a chuck 402 holding the wafer W in the process chamber K, a developing solution discharge nozzle 403 including a discharge port having almost the same length as a diameter of the wafer W and supplying a developing solution to the wafer W from the discharge port, a nozzle arm 404 moving the developing solution discharge nozzle 403 above the wafer W, and a developing solution supply device 405 supplying the developing solution in the predetermined flow rate and pressure to the developing solution discharge nozzle 403 and so on. A developing treatment in the developing unit 52 is performed by forming a liquid puddle of the developing solution on the wafer W with the developing solution discharge nozzle 403 moved from one end portion of the wafer W of the other end portion on the wafer W, discharging the developing solution, and by stopping the wafer W for a predetermined time in the condition having the liquid puddle.

In the second processing unit group G2, a resist coating unit 53 and a developing unit 54 are also provided in the order from below in the same way.

Figure 10:
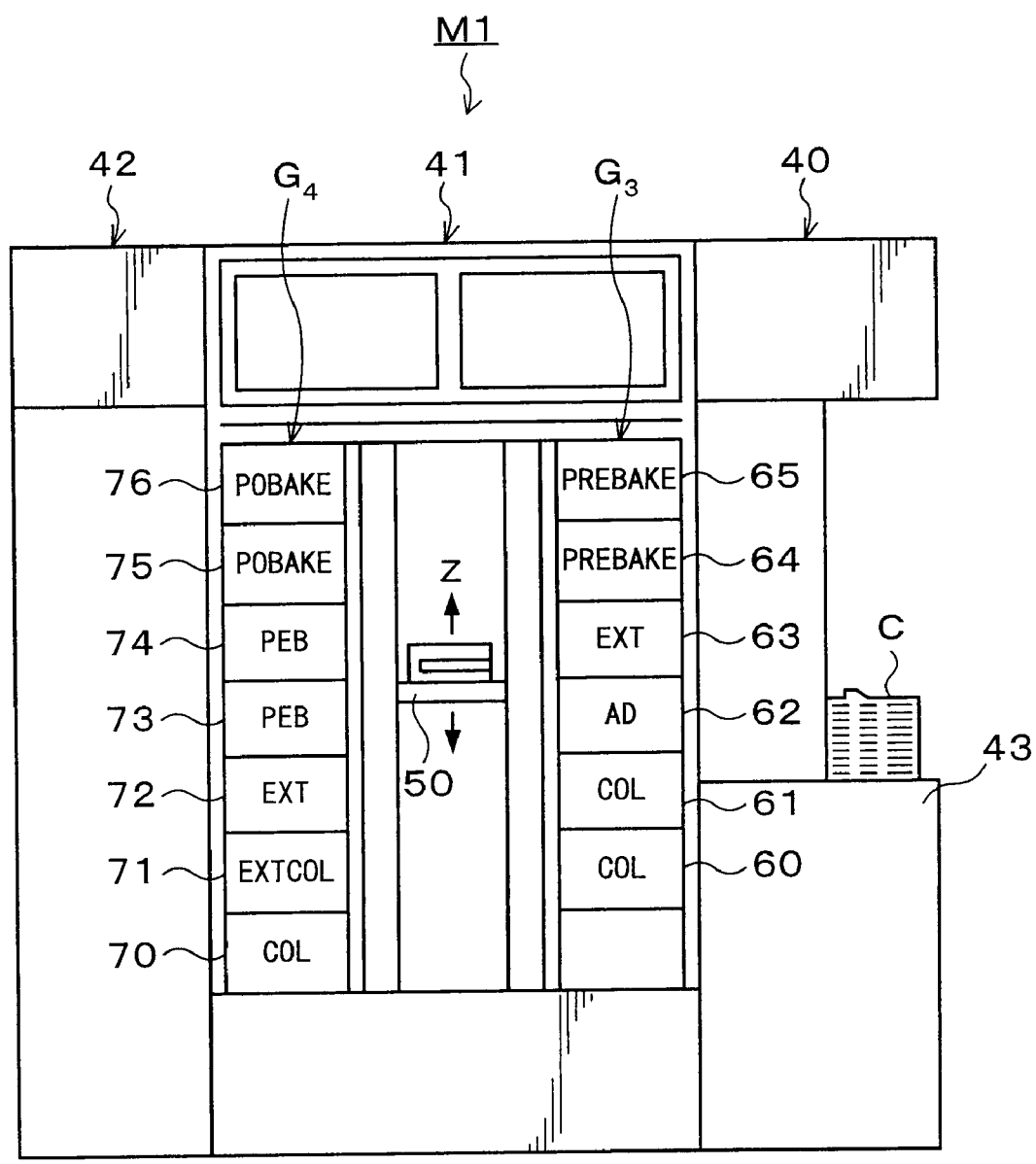
FIG. 10 is a rear view of the coating and developing system of FIG. 5.

Meanwhile, the third processing unit group G3 of the processing station 41 is arranged adjacently to the cassette station 40 as shown in FIG. 6. In the third processing unit group G3, for example, cooling units 60, 61 performing a cooling processing to the wafer W, an adhesion unit 62 for increasing the adherability between the resist solution and the wafer W, an extension unit 63 for transferring the wafer W, and prebaking units 64, 65 for evaporating a solvent in the resist solution are stacked in six-tiers in the order from below as shown in FIG. 10.

The fourth processing unit group G4 is disposed adjacently to the interface section 42. In the fourth processing unit group G4, for example, a cooling unit 70, an extension cooling unit 71 for naturally cooling the mounted wafer W, an extension unit 72, a postexposure baking units 73, 74 performing a heating processing after the exposure, and postbaking units 75, 76 performing the heating processing after the developing treatment are stacked, for example, in seven-tiers in the order from below. The above-described heating processing in the prebaking units 64, 65, postexposure baking units 73, 74 and the postbaking units 75, 76 are performed, for example, by mounting the wafer W on a heated plate of which temperature is kept constant for the predetermined time.

In the interface section 42, for example, a wafer carrier unit 80 and an edge exposure unit 81 are provided as shown in FIG. 6. The wafer carrier unit 80 has access to the extension cooling unit 71, the extension unit 72 belonging to the fourth processing unit group G4, the edge exposure unit 81 and the aligner not shown so as to carry the wafer W to each units.

Figure 11:
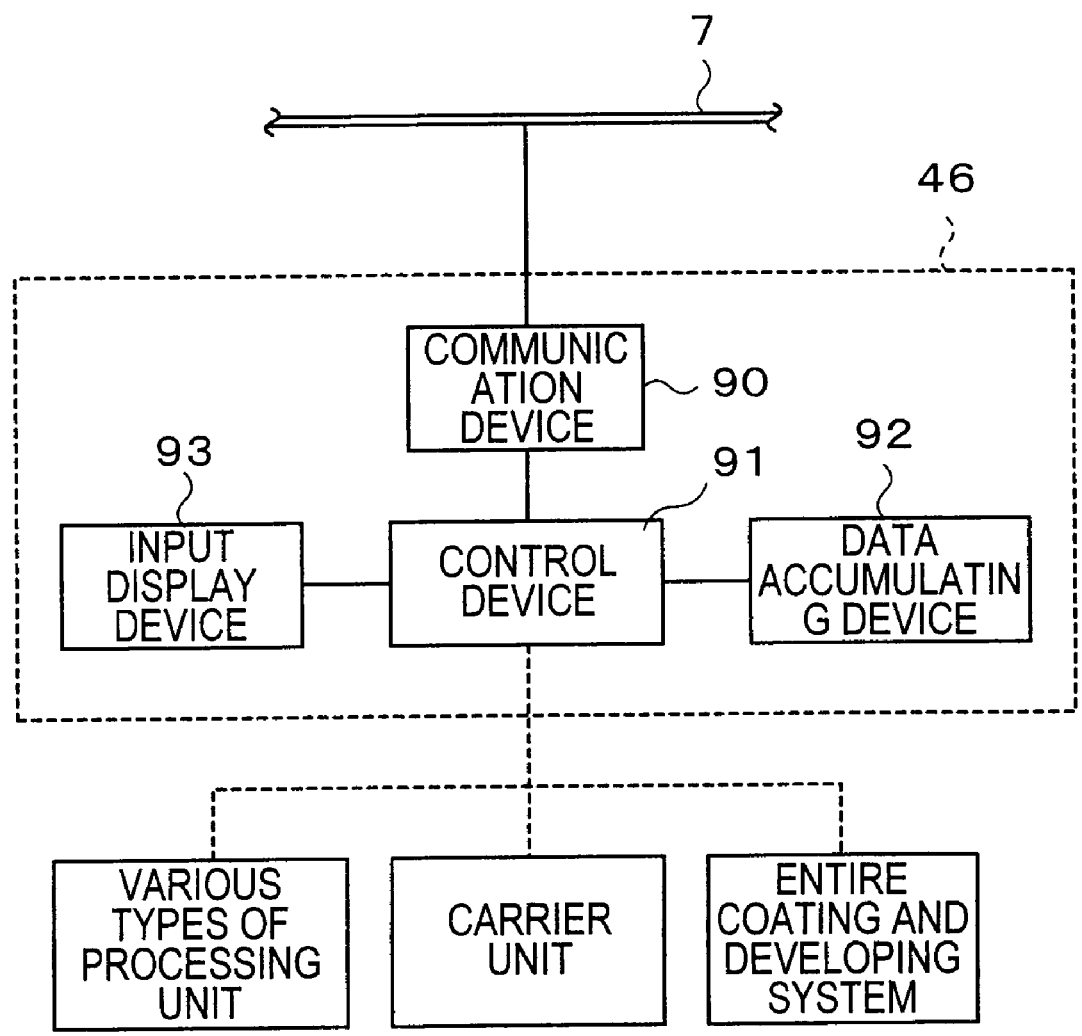
FIG. 11 is a block diagram showing a configuration of a control section.

Next, the structure of the control section 46 described above will be explained in detail. The control section 46 includes, for example, a communication device 90, a control device 90, a data accumulating device 92, and an input/display device 93 as shown in FIG. 11.

The communication device 90 is connected to, for example, the LAN 7, the information and signals can be communicate with the communication control unit 3 via the LAN 7. Therefore, the communication device 90 can transmit the log information accumulated in the data accumulating device 92 described later to the communication control unit 3 and can output the remote operation information received from the communication control unit 3 via the communication device 90.

In the control device 91, various types of settings such as a setting with respect to the entire process of the coating and developing system M1, a setting with respect to a processing recipe in each processing unit, or a setting with respect to a movement of a carrier unit can be performed. The control device 91 controls the entire coating and developing system M1, various types of processing units and the carrier unit based on the settings to achieve a desired coating and developing treatment. The control device 91 can change the above-described various settings based on the remote operation information outputted from the communication device 90, or can perform the maintenance work of the coating and developing system M1 by actually moving various types of elements in the respective units and adjusting them. Namely, the computer 5 can remotely operate the coating and developing system M1 by providing the remote operation information to the control device 91.

The data accumulating device 92 can temporarily store the log information such as various types of setting information, a running information and the like in the coating and developing system M1. The input/display device 93 is, for example, provided in the side portion of the coating and developing system M1 as shown in FIG. 5. The input/display device 93 is, for example, a touch screen. An operation screen is displayed on the input/display device 93, on which various types of setting of the coating and developing system M1 are performed, and the running condition of the coating and developing system M1 is shown. In addition, the video in the coating and developing system M1 captured by the above-described CCD camera 200 can be displayed on the input/display device 93, if necessary.

Subsequently, the movement of the coating and developing system M1 thus configured when processing the wafer will be described. First, one untreated wafer is picked up from the cassette C in the cassette station 40 and carried to the extension unit 63 belonging to the third processing unit group G3. Next, the wafer W is carried in the adhesion unit 62 by the main carrier unit 50 to have an adhesion treatment. After the adhesion treatment, the wafer W is carried to the cooling unit 60 and cooled to be the predetermined temperature. After that, the wafer W is carried to the resist coating unit 51 and the resist film is formed on the surface of the wafer W.

The wafer W on which the resist film is formed is carried to the prebaking unit 64 and the extension cooling unit 71 sequentially by the main carrier unit 50, and further, carried to the edge exposure unit 81 and the aligner (not shown) sequentially by the wafer carrier unit 80 to have the predetermined treatment in the respective units and the like. The wafer W of which exposure treatment has finished is carried to the extension unit 72 by the wafer carrier unit 80, then, carried to the postexposure baking unit 73, the cooling unit 60, the developing unit 52, the postbaking unit 75 and the cooling unit 61 sequentially to have the predetermined treatment in respective units. After that, the wafer W is carried to the extension unit 63, and returned to the cassette C to finish a series of the photolithography process.

Figure 12:
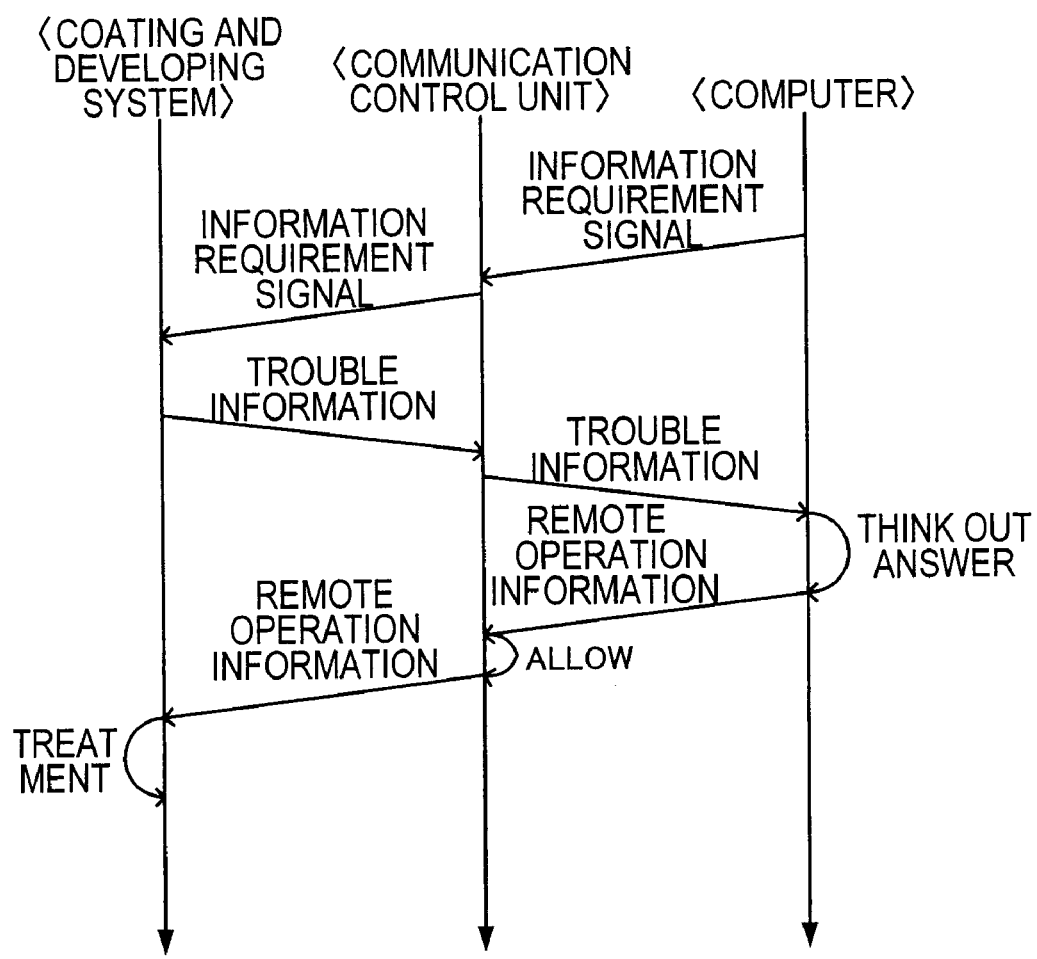
FIG. 12 is a control flow of the maintenance system.

In the coating and developing system M1 in which the wafer processing is performed, the operation of the maintenance system in the case that a trouble occurs will be explained. FIG. 12 shows a protocol flow of the operation of the maintenance system 1.

At the time of normal running of the coating and developing system M1, the allow/deny settings of the first and second stages of the communication control unit 3 are set to 'deny' by workers in the side of the factory 2. Therefore, the coating and developing system M1 can not be remotely operated from the side of the computer 5. When the trouble occurs in the coating and developing system M1, the occurrence of trouble is notified to the person in charge in the side of the vender 4, for example, from the worker in the side of the factory 2. The way of notice may be the telephone, the facsimile, or a communication network of the maintenance system may be used. In the case that the occurrence of trouble is notified to the person in charge in the side of the vendor 4 using the communication network, first, when the coating and developing system M1 is normally running, the communication allow/deny settings with respect to the respective information are set to 'deny', and when the trouble occurs, the worker in the side of the factory 2 selectively changes the communication allow/deny settings to 'allow' by the communication allow/deny setting button D. Since the worker in the side of the factory 2 selectively makes the communication allow setting, the information including, for example, the trouble as a classified matter which should not be known by the side of vendor 4, that is, the information including the classified matter, for example, on the process flow performed in the coating and developing system M1 where the trouble occurs is prevented from being revealed. In the case the occurrence of trouble should be notified as soon as possible, a warning alarm signal generated from the coating and developing system M1 when the trouble occurs may be automatically transmitted to the computer 5 in the side of the vendor 4 to notify the occurrence of trouble to the person in charge in the side of the vendor 4.

The person in charge in the side of the vendor to whom the occurrence of trouble is notified, first, transmits an information requirement signal of the trouble information to the side of the coating and developing system M1 for collecting the trouble information. The transmission requires a password to prevent an illegal access. The transmitted information requirement signal is transmitted to the communication control unit 3 via the Internet 6, and transmitted to the coating and developing system M1 from the communication control unit 3 via the LAN 7. In the coating and developing system M1 received the information requirement signal, when the communication allow/deny setting button D is set as 'allow', for example, the setting information and the running information displayed on the operation screen of the input/display device 93 at that time is transmitted from the communication device 91 to the computer 5. The entire operation screen displayed on the input/display device 93 can be transmitted to the computer 5. In addition, the log information accumulated in the data accumulating device 92, i.e., the setting information, the running information and the image information captured by the CCD camera 200 until the trouble occurs are transmitted to the computer 5.

The trouble information transmitted from the coating and developing system M1 is received by the computer 5 in the side of the vendor 4, and displayed on the display section 23 of the computer 5. When the entire operation screen of the input/display device 93 is transmitted, the operation screen is displayed on the display section 23. The person in charge in the side of the vendor comprehends an actual condition of, for example, the coating and developing system M1 by the display, and identifies a cause of the trouble to think out an answer. The person in charge who thinks out the answer inputs the answer from the input section 21 as a remote operation information. For example, when the trouble occurs in the main carrier unit 50, and the cause of trouble is found in the wafer carrier arm 50a, for example, the setting-change information for changing the setting of a stop position of the wafer carrier arm 50a, the driving-adjustment information for adjusting the wafer carrier arm 50a by actually moving it, and the movement-confirmation information for confirming the movement of the wafer carrier arm 50a are inputted to the input section 21.

For example, during the time from the occurrence of trouble is notified to the person in charge in the side of the vendor 4 until the remote operation information is transmitted, the worker in the side of the factory 2 changes the allow/deny settings of the first and second stages of the communication control unit 3 to 'allow'. The change is performed after confirming all persons get clear of the coating and developing system M1. According to the change, the remote operation information transmitted from the computer 5 in the side of the vendor 4 is provided to the coating and developing system M1, and the remote operation from the side of the vendor is allowed to be performed.

The remote operation information inputted to the input section 21 is transmitted to the communication control unit 3 in the side of the factory 2 from the communication section 20 via the Internet 6. In the communication control unit 3, the allow/deny settings of all remote operations are 'allow' so that the communication control unit 3 transmits the remote operation information to the coating and developing system M1. In the coating and developing system M1 received the remote operation information, a repair work for the trouble is performed based on the remote operation information. For example, the wafer carrier arm 50a is moved and the stop position thereof is adjusted, and the setting of the stop position of the wafer carrier arm 50a is changed. Then, the wafer carrier arm 50a is activated and the movement of the wafer carrier arm 50a is confirmed. Accordingly, the cause of trouble is resolved. After that, the allow/deny settings of all remote operations are changed to 'deny' by the worker so that the remote operation cannot be performed. If necessary, the communication allow/deny setting can also be changed to 'deny'.

In the maintenance system 1, since the remote operation is performed after the remote operation is set to 'allow' by the worker of the factory 2, the worker is prevented from being injured by the wafer carrier arm 50a of the main carrier unit 50 which is driven while the worker does not notice.

In the case that the worker gets clear of the field during the remote operation, for example as shown in FIG. 2, the allow/deny setting of the first stage, i.e., the transmission of the static remote operation information not accompanying the actual driving of various types of elements is made to be 'allow', and the allow/deny setting of the second stage, i.e., the transmission of the dynamic remote operation information accompanying the actual driving is made to be 'deny'. By doing this, the remote operation accompanying the actual driving can not be performed so that a third person getting close to the coating and developing system M1 when the worker does not watch is prevented from being injured by the driving elements such as the wafer carrier arm 50a. At the same time, since the allow/deny setting of the first stage is kept 'allow', the information not accompanying the driving such as the setting-change information can be transmitted so that riskless remote operations can be continued even if the worker leaves the field. In this case, even though the remote operation is riskless, the content of the static remote operation information which is changed during the worker's absence, can be displayed, for example, on the input/display device 93. Accordingly, the worker easily comprehends the changed matter during his absence. And further, the structure of units in the coating and developing system M1 can be displayed on the screen of, for example, the input/display device 93 (status screen) in advance, and the unit in which some change exists can be displayed so that it can be discriminated on the status screen. At that time, the unit in which some change exists can be displayed with another color, or the unit can be displayed in a turn on/off mode.

Figure 13:
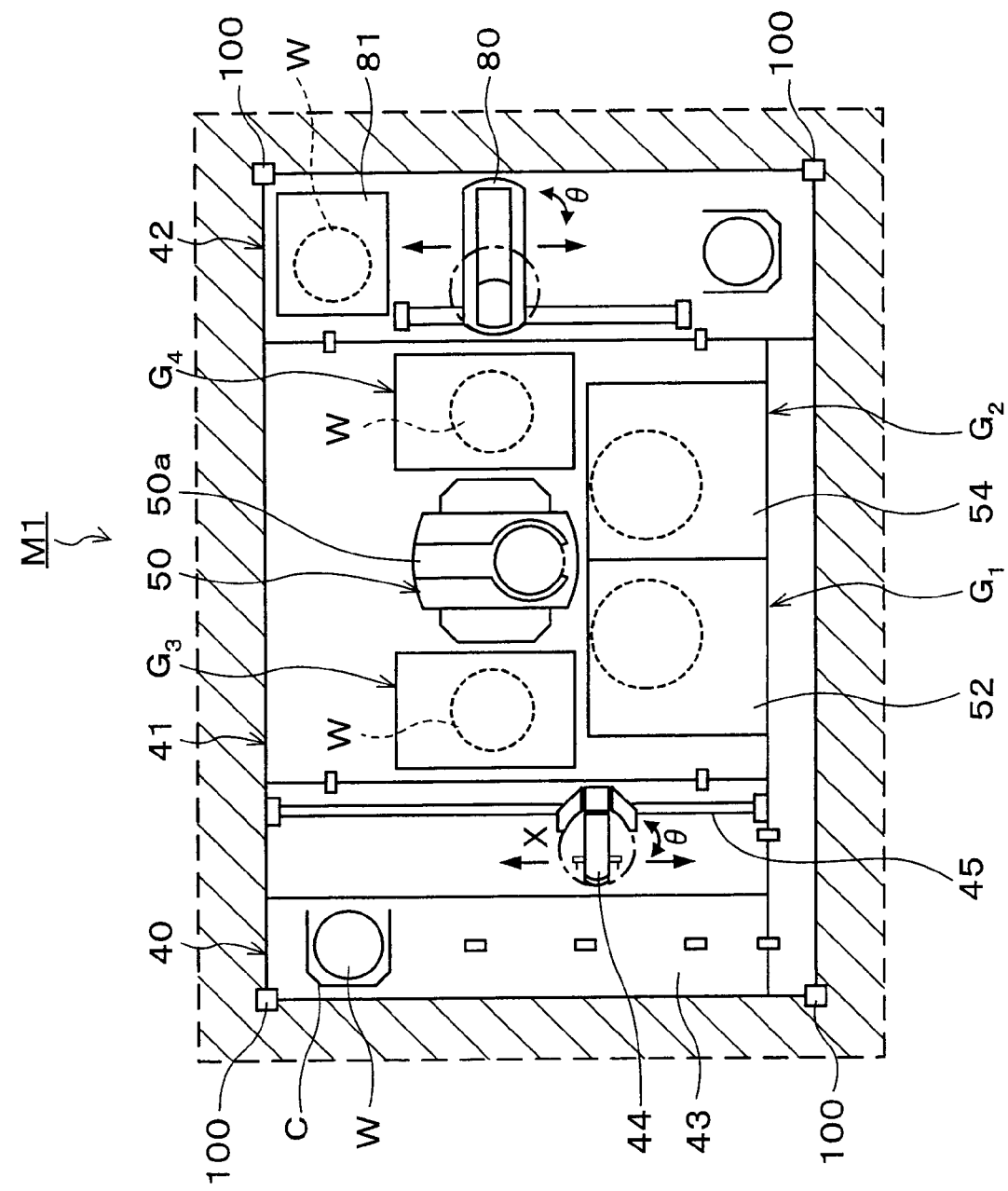
FIG. 13 is a coding and developing system.

To the coating and developing system M1 described in above embodiment, a sensor for detecting an approach of a person can be installed to disable the remote operation when the person approaches the apparatus. FIG. 13 shows such example, and an infrared sensor 100 capable of detecting the person is installed to the coating and developing system M1. The infrared sensor 100 is installed so that it can detect that the person comes in, for example, a peripheral area (oblique lines area in FIG. 13) of the coating and developing system M1. The detected information by the infrared sensor 100 can be outputted to the control device 91, and outputted to the communication control unit 3 from the control device 91. In the communication control unit 3, the allow setting of the remote operation can be automatically changed to 'deny' based on the detected information. By such configuration, when a person other than the worker accidentally approaches the coating and developing system M1, the remote operation automatically disabled to secure the safety of the remote operation. In this case, the remote operation accompanying the movement of various kinds of driving elements in the coating and developing system M1, i.e., the dynamic remote operation can be disabled based on the detection of approach by the person. And further, when the approaching person is detected, it is possible to sound an alarm and to stop the driving elements operated at that time.

Furthermore, the operation for starting the detection by the infrared sensor 100 can be performed both in the side of the factory 2 and in the side of the vendor 4, and the operation for stopping the detection by the infrared sensor 100 can be performed only in the side of the factory 2. For example, in the coating and developing system M1 in the side of the factory 2, an on/off switch of the infrared sensor 100 is provided, and in the computer 5 in the side of the vendor 4, an on-switch alone of the infrared sensor 100 is provided. By doing this, the infrared sensor 100 can be operated from the side of the factory 2 and from the side of the vendor 4, if needed. In addition, the side of the vendor 4 incapable grasping the condition in the factory 2 is not able to arbitrarily switch off the infrared sensor 100. As a result, the infrared sensor 100 is not switched off against the will of the side of the factory 2, and the remote operation is not continued under the off-state of the sensor. Therefore, all person accidentally approaches the coating and developing system M1 is certainly detected to improve the safety of the remote control of the coating and developing system M1.

Instead of the infrared sensor 100, a sensor capable of selectively detecting the approach of the person other than the prescribed worker can be applied. In this case, for example, identification codes in respective coating and developing systems M1~Mn different from each other are previously given to the workers taking charge of the coating and developing system M1~Mn in the factory 2, and the identification code is given to each worker in the form of being identified by the sensor. The identification code can be given to, for example, a name plate or a working wear of the worker. When the sensor, for example, detects the identification code of the worker in charge, the remote operation is continued, whereas when the sensor detects the identification code other than the code of the worker in charge, the remote operation is disabled. Specifically, when the worker in charge approaches the coating and developing system M1, the remote operation is kept on being performed, and when the person other than the worker in charge approaches the coating and developing system M1, the remote operation is stopped. As a result, when the person other than the worker in charge accidentally approaches the coating and developing system M1, the person is prevented from being injured by the remote operation. When the worker in charge approaches, the remote operation does not stop so that the repair work for the trouble can be performed immediately.

The embodiment described above is the maintenance system concerning the coating and developing systems M1~Mn, however, the substrate processing apparatus constituting the maintenance system is not limited to the coating and developing system, and the other substrate processing apparatuses such as an aligner, an etching apparatus and the like can be adopted. In addition, the present embodiment is the maintenance system only for the coating and developing system, however, the present invention can be applied to the maintenance system for plural kinds of substrate processing apparatuses. And further, the substrate processing apparatuses can be installed at plural factories. The communication control unit 3 does not need to be an independent apparatus, it can be provided inside the substrate processing apparatus. Additionally, the control device in the substrate processing apparatus may function as the communication control unit 3.

The computer 5 in the side of the vendor 4 does not need to be installed at one place, and can be installed at plural places. The setting position of the computer 5 is not limited to the side of the vendor 4, and can be the position distant from the substrate processing apparatus in the factory 2, for example, the position outside the clean room R.

In the above embodiment, the maintenance system 1 of the present invention is used for coping with the trouble, however, the present invention can be used for a periodical maintenance other than the trouble. The substrate dealt with by the substrate processing apparatus is not limited to the wafer, it can be a substrate other than the wafer, for example, a LCD substrate or a mask/reticle substrate for a photomask.

Industrial Availability

The present invention is available when a remote operating is performed with respect to a substrate processing apparatus manufacturing a semiconductor device and a LCD substrate and the like.

The invention claimed is:

1. A substrate processing apparatus, comprising:
various types of elements including a substrate carrier member for performing a substrate processing;
a control section in which a remote operation information transmitted from a remote control unit in a remote place through a communication network is provided only when there is an allow setting of a remote operation by a worker of said substrate processing apparatus with the safety of the remote operation work being confirmed, and said various types of elements are controlled based on the provided remote operation information; and
an allow-setting section for performing the allow setting of the remote operation,
wherein in the allow-setting section, the allow setting of the remote operation is divided into plurality stages, and a first allow setting of the remote operation accompanying a driving of said substrate processing apparatus and a second allow setting of the remote operation not accompanying the driving of said substrate processing are included in separate stages,
wherein the first allow setting of the remote operation accompanying the driving of said substrate processing apparatus comprises,
a position adjustment for a substrate carrier arm, a resist solution discharge nozzle in a resist coating unit and a developing solution discharge nozzle in a developing unit, and
a movement confirmation of the substrate carrier arm, the resist solution discharge nozzle and the developing solution discharge nozzle, and
wherein the second allow setting of the remote operation not accompanying the driving of said substrate processing apparatus comprises,
a setting change for a discharge amount of the resist solution, a discharge pressure of the resist solution, a turning speed of a substrate, an atmospheric temperature and an atmospheric humidity in the resist coating unit,
a setting change for a discharge amount of the developing solution, a discharge pressure of the developing solution, an atmospheric temperature and an atmospheric humidity in the developing unit, and
a setting change for a heating temperature and a heating time of the substrate in a heating unit.

2. The substrate processing apparatus as set forth in claim 1,
the allow-setting section for performing the allow setting of the remote operation is provided only on a substrate processing apparatus side of the communication network.

3. The substrate processing apparatus as set forth in claim 1, further comprising:
a sensor for detecting an approach of a person to said substrate processing apparatus.

4. The substrate processing apparatus as set forth in claim 2,
a communication section for performing the allow setting of the remote operation only on a substrate processing apparatus side of the communication network,
wherein an information communication performed through said communication network is enabled only when there is an allow setting for a communication.

5. The substrate processing apparatus as set forth in claim 3, wherein the control section is configured to perform:
an operation for starting a detection by said sensor can be performed in the side of said substrate processing apparatus or in the side of said remote operation unit with said communication network put therebetween; and
an operation for stopping the detection by said sensor can be performed only in the side of said substrate processing apparatus.

6. The substrate processing apparatus as set forth in claim 3, wherein said sensor is configured to selectively detect the approach of the person other than workers identified in advance.

7. A substrate processing apparatus, comprising:
various types of elements including a substrate carrier member for performing a substrate processing;
a control section in which a remote operation information transmitted from a remote control unit in a remote place through a communication network is provided only when there is an allow setting of a remote operation by a worker of said substrate processing apparatus with the safety of the remote operation work being confirmed, and said various types of elements are controlled based on the provided remote operation information; and
an input section for allowing or denying the allow setting of the remote operation,
wherein in the input section, the allow setting of the remote operation is divided into plurality stages, and a first allow setting of the remote operation accompanying a driving of said substrate processing apparatus and a second allow setting of the remote operation not accompanying the driving of said substrate processing are included in separate stages,
wherein the first allow setting of the remote operation accompanying the driving of said substrate processing apparatus comprises,
a position adjustment for a substrate carrier arm, a resist solution discharge nozzle in a resist coating unit and a developing solution discharge nozzle in a developing unit, and
a movement confirmation of the substrate carrier arm, the resist solution discharge nozzle and the developing solution discharge nozzle, and
wherein the second allow setting of the remote operation not accompanying the driving of said substrate processing apparatus comprises,
a setting change for a discharge amount of the resist solution, a discharge pressure of the resist solution, a turning speed of a substrate, an atmospheric temperature and an atmospheric humidity in the resist coating unit,
a setting change for a discharge amount of the developing solution, a discharge pressure of the developing solution, an atmospheric temperature and an atmospheric humidity in the developing unit, and
a setting change for a heating temperature and a heating time of the substrate in a heating unit.

* * * * *